US006160439A

United States Patent [19]

Abe et al.

[11] Patent Number: 6,160,439

[45] Date of Patent: *Dec. 12, 2000

[54] CURRENT FEED CONTROL CIRCUIT AND ELECTRONIC APPLIANCE USING THE SAME

[75] Inventors: Taisuke Abe, Joyo; Mitsuhiko Kikuoka, Yawata; Kengo Matsuda, Hirakata; Masami Segawa, Izumi, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/907,457

[22] Filed: Aug. 8, 1997

[30] Foreign Application Priority Data

| | | | |
|---|---|---|---|
| Aug. 9, 1996 | [JP] | Japan | 8-210956 |
| Oct. 1, 1996 | [JP] | Japan | 8-260398 |
| Mar. 25, 1997 | [JP] | Japan | 9-071355 |

[51] Int. Cl.[7] .......... H03K 17/72

[52] U.S. Cl. .......... 327/438; 327/520; 323/300

[58] Field of Search .......... 327/441, 450, 327/452, 453, 447, 455, 438, 461, 464, 519–520; 323/300, 311, 312, 313

[56] References Cited

U.S. PATENT DOCUMENTS

| | | | |
|---|---|---|---|
| 3,939,394 | 2/1976 | Suzuki | 363/128 |
| 4,300,090 | 11/1981 | Weber | 323/311 |
| 4,480,197 | 10/1984 | Hollaway | 327/403 |
| 4,603,289 | 7/1986 | McLellan | 323/277 |
| 4,878,010 | 10/1989 | Weber | 323/300 |

*Primary Examiner*—Timothy P. Callahan
*Assistant Examiner*—Minh Nguyen
*Attorney, Agent, or Firm*—McDermott, Will & Emery

[57] ABSTRACT

The constitution includes a heater 2 used as current receiving element, a thyristor 3 placed in the current travelling route of the heater 2, a series connection circuit of a capacitor 4 and diode 5 for control power source connected parallel to the thyristor 3, a Zener diode 9 as a constant voltage element connected to the gate of the thyristor 3, and a control circuit 6 connected parallel to the capacitor 4, with its control terminal connected to the gate of the thyristor 3, whereby a specified control voltage determined by the Zener voltage of the Zener diode 9 is obtained at the first capacitor 4 by the control of the thyristor 3, so that the transformer for stepping down the supply voltage is not necessary.

27 Claims, 6 Drawing Sheets

CURRENT FEED CONTROL CIRCUIT AND ELECTRONIC APPLIANCE USING THE SAME

TECHNICAL FIELD

The present invention relates to a current feed control circuit for controlling current fed to an electronic appliance and various electronic appliances using the same.

BACKGROUND ART

For example, when attempted to export electronic appliances such as electric hot box to various countries, since the commercial supply voltage differs in each country, it is necessary to replace the transformer to obtain a direct-current voltage for control.

The replacement of transformer is actually very difficult in design work, and it is not enough to prepare transformers corresponding to the commercial supply voltage of 110 V in Taiwan, 220 V in China, 120 V in United States, and 230 to 240 V in Europe, but an appropriate current suited to each appliance is needed, which may require renewal of design. Trial production, procurement and replacement of transformer take much time and labor, which results in high cost of the electronic appliances.

DISCLOSURE OF THE INVENTION

It is hence an object of the invention to present a current feed control circuit applicable to different supply voltages without requiring transformer or the like, and an electronic appliance using the same, at low cost.

To achieve the object, the constitution of the invention comprises a current receiving element, a thyristor placed in the current travelling route of this current receiving element, a series connection circuit of a first capacitor and a first diode for power source of a control circuit connected parallel to this thyristor, a constant voltage element connected to the gate of the thyristor, and a control circuit connected parallel to the capacitor, with its control terminal connected to the gate of the thyristor, whereby regardless of the commercial supply voltage to be connected, a specified power voltage for the control circuit is obtained in the first capacitor by the thyristor control by the constant voltage element connected to the gate of the thyristor, and hence the conventional transformer is not necessary, so that it can be presented at low cost.

BEST MODE FOR CARRYING OF THE INVENTION

Embodiment 1

Figure 1:
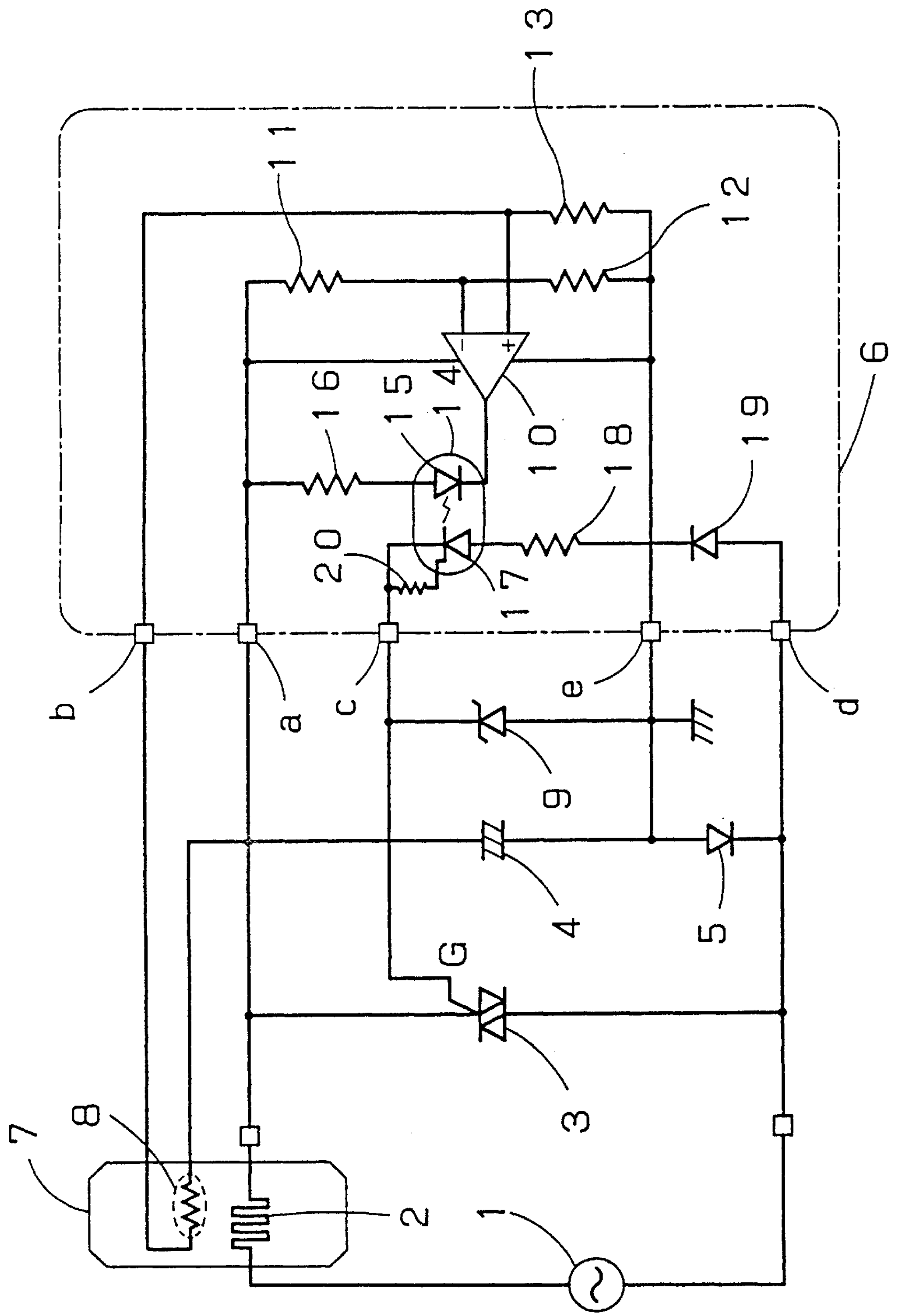
FIG. 1 is a circuit diagram of a current feed control circuit in a first embodiment of the invention.

A first embodiment of the invention is described below by referring to the drawing.

In FIG. 1, reference numeral 1 is, for example, an alternating-current commercial power source of 100 V, and in its current travelling route to a heater 2 as a current receiving element and a bidirectional three-terminal thyristor (hereinafter called thyristor) 3 are connected.

A series connection circuit of a capacitor 4 for power source of a control circuit and a diode 5 are connected parallel to this thyristor 3.

A control circuit 6 is connected to the capacitor 4 through terminals a and e.

That is, this heater 2 is for heating in a hot compartment 7 in this embodiment, and the temperature in the hot compartment 7 is detected by a temperature sensor 8 composed of a negative temperature characteristic thermistor, and is transmitted to the control circuit 6 through a terminal b, and by current feed control to the heater 2 by this control circuit 6, it is designed to keep constant the temperature in the hot compartment 7.

More specifically, at the gate of the thyristor 3, a Zener diode 9 as constant voltage element, and a control terminal c of the control circuit 6 are connected.

In the control circuit 6, moreover, a comparator 10 is provided, and connection points of resistor 11, 12 are connected to an inverting input terminal of this comparator 10, while a connection point of the temperature sensor 8 and resistance 13 is connected to a non-inverting input terminal of the comparator 10.

A series connection circuit of a light emitting diode 15 of a photo thyristor 14 and a resistor 16 are connected to an output terminal of the comparator 10.

Moreover, the anode side of a thyristor 17 of this photo thyristor 14 is connected to the alternating-current commercial power source 1 through a resistor 18, diode 19, and a terminal d.

The cathode of the thyristor 17 and the gate with a resistor 20 are connected to the gate of the thyristor 3 through the terminal c.

Once the alternating-current commercial power source 1 is connected, power is fed into the heater 2, and in the positive half cycle of the alternating-current voltage, the thyristor 3 is not turned on until the voltage is raised from zero to 10 V, and in this period, the capacitor 4 is charged through the diode 5.

That is, since the Zener voltage of the Zener diode 9 is set at 10 V, the gate current of the thyristor 3 does not flow in the positive half cycle of the alternating-current voltage until the voltage is raised to 10 V, and hence the thyristor 3 is not ignited, and in this period the capacitor 4 is being charged, and the charged voltage of the capacitor 4 is the power voltage of the control circuit 6.

What is of particular note herein is that if the alternating-current commercial power source 1 is changed over to 110 V, 120 V or 220 V, that is, if the voltage varies depending on the export destination country, by setting the Zener voltage of the Zener diode 9 at 10 V, the thyristor 3 is not ignited in the positive half cycle until the voltage is raised to 10 V, so that the capacitor 4 is always charged at 10 V.

That is, however the alternating-current commercial power source 1 varies, the control circuit 6 can be used without any change, and the cost may be substantially lowered as compared with the conventional constitution of obtaining a control voltage of 10 V by a transformer suited to the local voltage.

At this power voltage of 10 V, the control circuit 6 operates, and while the temperature is low in the hot compartment 7, the resistance of the temperature sensor 8 is large, and the voltage of the non-inverting input terminal of the comparator 10 is lower than the voltage of the inverting input terminal, so that the output of the comparator 10 is low.

As a result, power is fed into the light-emitting diode 15, and the thyristor 17 is turned on by its light emission, and the gate current of the thyristor 3 flows, and the thyristor 3 is turned on, so that power is fed to the heater 2.

At this time, the thyristor 3 is turned on in both positive half cycle and negative half cycle, and so that the heater 2 heats in high mode.

In the positive half cycle, it its turned on when exceeding the Zener voltage of the Zener diode 9, but in the negative half cycle, since the thyristor 17 is turned on, the gate current of the thyristor 3 is supplied through the diode 19, resistor 18, and thyristor 17.

Consequently, the temperature in the hot compartment 7 is raised and soon reaches a set temperature, and the voltage at the non-inverting input terminal of the comparator 10 becomes higher than the voltage at the inverting input terminal, so that the output of the comparator 10 becomes high.

As a result, power feeding into the light emitting diode 15 is cut off, its light emission stops, and the thyristor 17 is turned off.

In the negative half cycle, hence, gate current is not supplied into the thyristor 3, and in this negative half cycle, power feeding to the heater 2 is cut off.

Of course, in the positive half cycle, the thyristor 3 is turned on when exceeding 10 V, and power is fed to the heater 2, but since the current is fed only in half wave, heating is in low mode, that is, keeping warmth is effected. After reaching the set temperature, positive half wave is supplied to the heater 2, and therefore in order that the temperature in the hot compartment 7 may not be raised suddenly by this keeping warmth operation, the rating of the heater 2 or the like must be considered sufficiently.

In this way, the circuit is designed to operate the thyristor 3 only in the positive half cycle, so that a control voltage of control circuit of 10 V may be always obtained by the capacitor 4.

In this embodiment, the heater 2 is used as an example of current receiving element, but, instead of the heater 2, a motor may be used as the current receiving element. In such a case, the temperature sensor 8 is replaced by a sensor for directly detecting the rotation of the motor, for example, known means making use of optical, magnetic or centrifugal force, capable of detecting the rotation of the motor shaft or object rotated by the motor, and the output of the sensor is applied to the comparator 10, and it is designed to cut off the thyristor 3 in the negative half cycle when the motor rotating speed increases, thereby cutting off power feeding to the motor.

In such constitution, it may be also used in such application as to cool by rotating the fan, for example, by the motor, and in this case, instead of directly detecting the motor rotating speed, the cooling effect may be indirectly detected by the temperature sensor 8.

Still more, as the current receiving element, a lamp may be used instead of the heater 2. In such a case, the temperature sensor 8 is replaced by a sensor for directly detecting the illumination by the lamp, and the sensor output is applied to the comparator 10, and when the illumination by the lamp increases, it may be designed so that the thyristor 3 is turned off in the negative half cycle, thereby cutting off the current feeding to the lamp.

In such constitution, it may be used in such applications as to promote growth of animals and plants by illuminating. In this case, the heat generated by the lamp may be measured by the temperature sensor 8 so as to measure the illumination indirectly.

Thus, by application of the embodiment, the heater 2 may be replaced by an electric component or electronic component acting by current feeding, or the temperature sensor 8 may be replaced by a sensor causing changes by receiving the action of this electric component or electronic component, so that the action by current feeding to the current receiving element may be controlled by the thyristor 3 in negative feedback.

Embodiment 2

Figure 2:
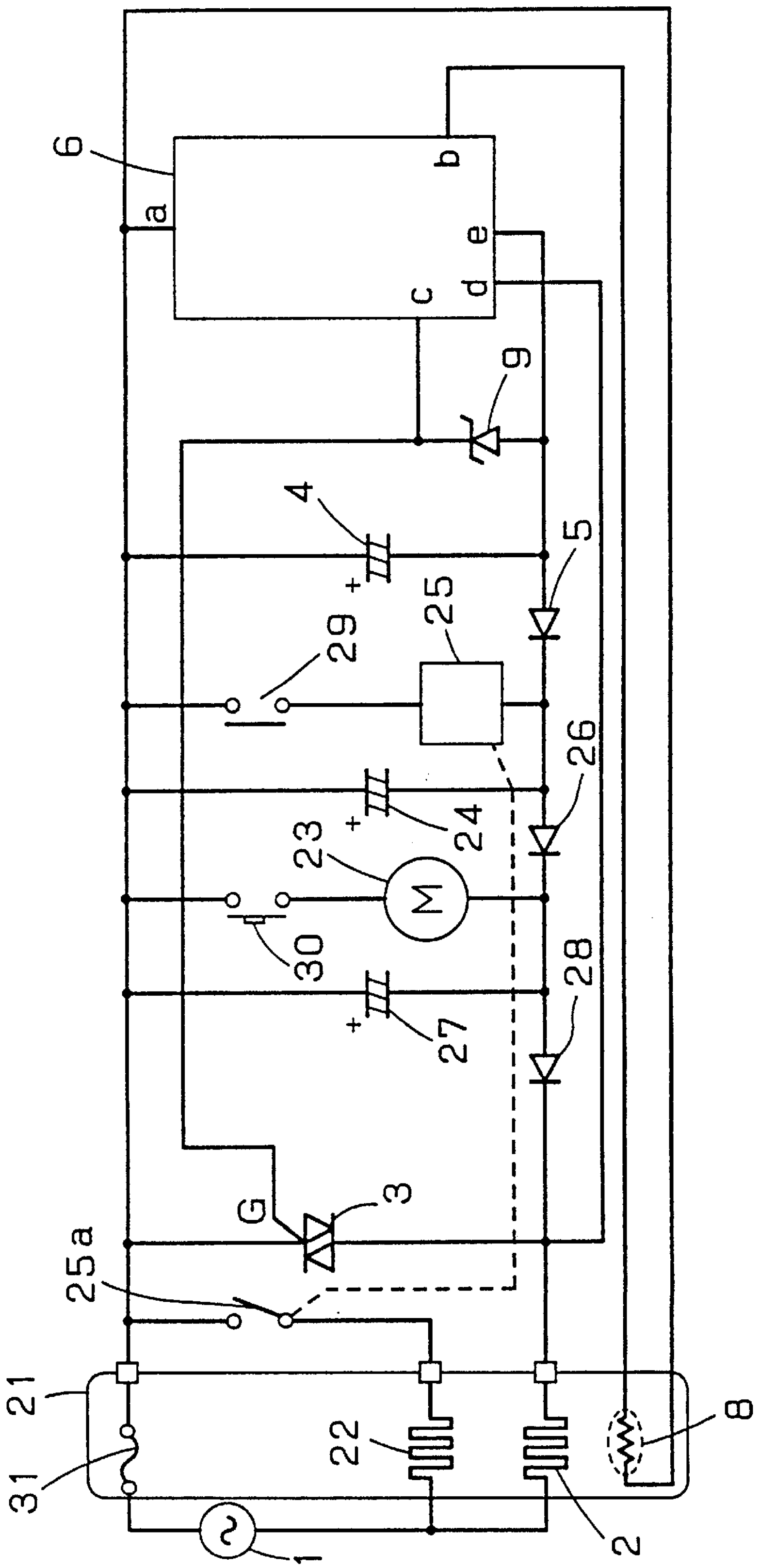
FIG. 2 is a circuit diagram of a current feed control circuit in a second embodiment of the invention.

FIG. 2 shows a second embodiment of the invention, and in this embodiment, the heater 2 is used as a water heater 21.

That is, because of the water heater 21, aside from the heater 2, a boiling heater 22 and a pouring motor 23 are added.

In the circuit configuration, before the series connection circuit of the capacitor 4 and diode 5, a parallel circuit of capacitor 24 and a relay 25 is connected, and a parallel circuit of the motor 23 and a capacitor 27 is connected through a diode 26, and further a diode 28 is connected to the heater 2.

When boiling water, a switch 29 is turned on, and a switch **25*a* is turned on by a relay 25 so as to feed current also to the boiling heater 22, and at this time the current is fed also to the heater 2** for keeping warmth, so that boiling continues.

When boiling completely, the switch 29 is turned off (or the switch 29 may be cut off by a control circuit not shown), and current feeding to the boiling heater 22 is cut off, and thereafter the temperature is maintained by the keeping warmth heater 2.

To pour hot water, a switch 30 is turned on to start the motor 23.

In the control circuit 6, exactly same as in the embodiment in FIG. 1, a power voltage of 10 V is applied by the capacitor 4, and the temperature of the heater 2 is controlled, and what is of particular note herein is that the capacitor 4 is provided at the side closest to the control circuit 6.

In other words, by forming the capacitor 24 for power source of the relay 25 and the capacitor 27 for power source of the motor 23 in the preceding stage, the power voltage of the control circuit by the capacitor 4 can be prevented from fluctuating upon start of the relay 25 and motor 23.

That is, the capacitors 4, 24, 27 are charged similarly at 10 V in OFF state until reaching the Zener voltage of the Zener diode 9 in the positive half cycle of thyristor 3, but by placing the capacitor 4 for the control circuit 6 in the most rear stage, the voltage fluctuation of the capacitor 4 does not occur even when the motor 23 or relay 25 is started, so that the control by the control circuit 6 may be extremely stable.

Reference numeral 31 denotes a fuse.

In this embodiment too, same as in the case of FIG. 1 relating to the first embodiment, as the current receiving element, the heater 2 may be replaced by motor, lamp, or other electric component or electronic component, and the temperature sensor 8 may be similarly replaced by a sensor for detecting the motor rotation directly or indirectly, a sensor for detecting the illumination by the lamp directly or indirectly, or the sensor for detecting the action of the current receiving element, and by adjusting the operation of the control circuit accordingly, the action of current feeding to the current receiving element by the thyristor 3 may be controlled in negative feedback same as in the first embodiment, and moreover by adding the boiling heater 22 to the heater 2 as the current receiving element for keeping warmth, means for passing larger current may be provided. By applying this embodiment, for example, the illumination of the lamp may be usually kept low, and changed over to high level only when necessary.

Embodiment 3

A third embodiment of the invention is described below while referring to the drawing.

Figure 3:
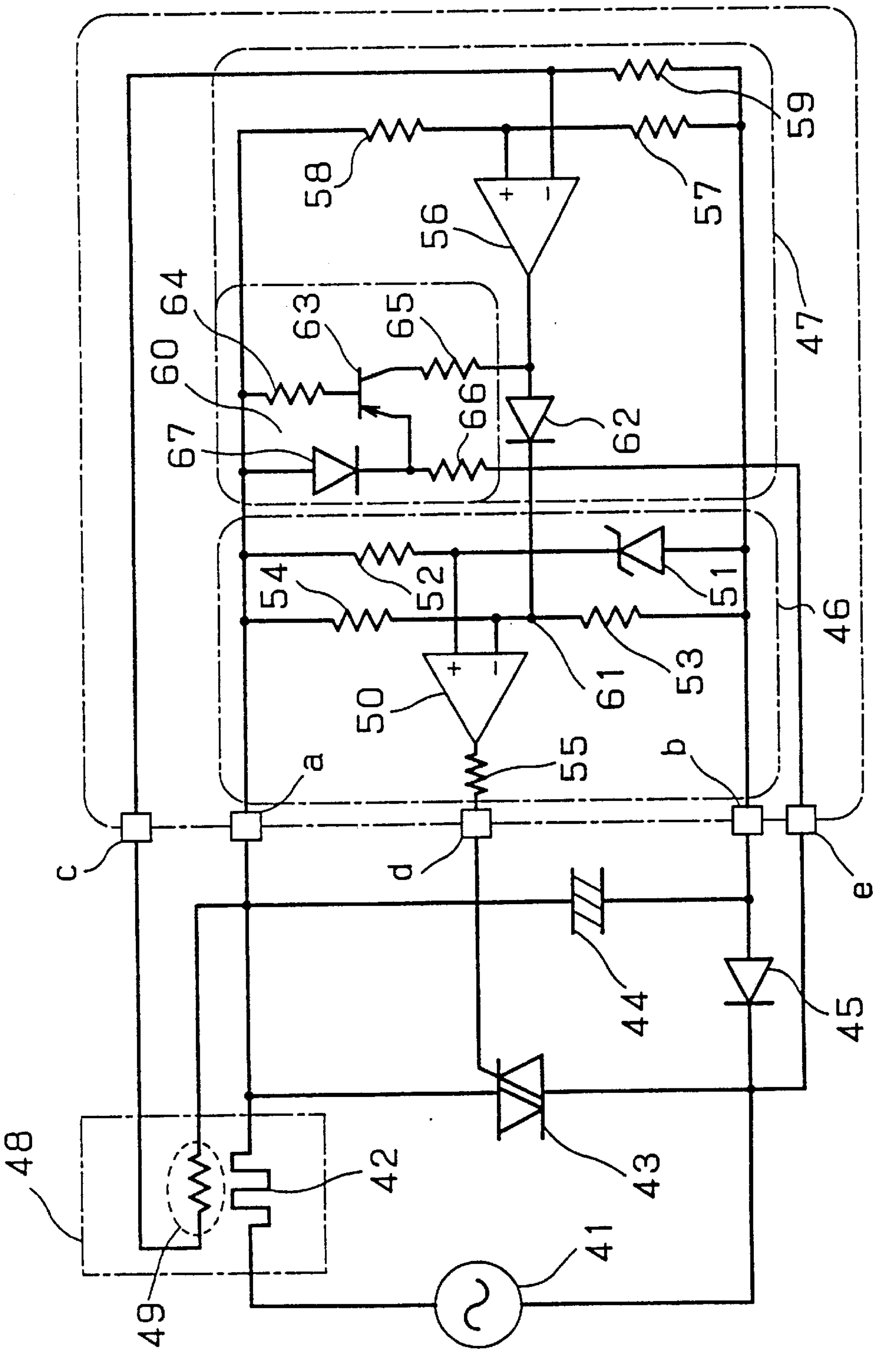
FIG. 3 is a circuit diagram of a current feed control circuit in a third embodiment of the invention.

In FIG. 3, reference numeral 41 is, for example, an alternating-current commercial power source of 100 V, and in its current travelling route to a heater 42 as a current receiving element and a bidirectional three-terminal thyristor (hereinafter called thyristor) 43 are connected.

A series connection circuit of a capacitor 44 for power source of the control circuit and a diode 45 are connected parallel to this thyristor 43.

A constant voltage circuit 46 and a control circuit 47 are connected to the capacitor 44 through terminals a and b.

That is, this heater 42 is for heating in a hot compartment 48 in this embodiment, and the temperature in the hot compartment 48 is detected by a temperature sensor 49 composed of a negative temperature characteristic thermistor, and is transmitted to the control circuit 47 through a terminal c, and by current feed control to the heater 42 by this control circuit 47 and the constant voltage circuit 46, it is designed to keep constant the temperature in the hot compartment 48.

More specifically, at the gate of the thyristor 43, an output terminal d of the constant voltage circuit 46 is connected.

The constant voltage circuit 46 is composed of a comparator 50, a Zener diode 51 used as constant voltage element being connected between the reference voltage input terminal of the comparator 50 and terminal b, a resistor 52 connected between the reference voltage input terminal and terminal a, resistor 53 and 54 connected in series between the terminals a and b, with the mutual connection points connected to the comparative voltage input terminal of the comparator 50, and a resistor 55 connected between the output terminal of the comparator 50 and terminal d.

The control circuit 47 is composed of a comparator 56, a resistor 57 connected between the reference voltage input terminal of this comparator 56 and terminal b, a resistor 58 connected between the reference input terminal and terminal a, a resistor 59 connected between the comparative voltage input terminal of the comparator 56 and terminal b, and a diode 62 of which anode is connected to the output terminal of the comparator 56 and cathode to the output terminal 61 of the control circuit 47. The comparative input terminal of the comparator 56 is connected to the terminal c, and the output terminal 61 of the control circuit 4 is connected to the comparative input terminal of the constant voltage circuit 46.

A polarity judging circuit 60 is composed of a resistor 65 having one end connected to the output terminal of the comparator 56 of the control circuit 47, a transistor 63 having its collector connected to the other end of the resistor 65, a resistor 64 connected between the base of the transistor 63 and terminal a, a diode 67 of which cathode is connected to the emitter of the transistor 63 and anode to the terminal a, and a resistor 66 connected between the emitter of the transistor 63 and the cathode side of the diode 45 through terminal e.

Once the alternating-current commercial power source 41 is connected, power is fed into the heater 42, and in the positive half cycle of the alternating-current voltage, the thyristor 43 is not turned on until the voltage is raised from zero to 10 V by the setting of the constant voltage circuit 46, and in this period, the capacitor 44 is charged through the diode 45.

That is, since the Zener voltage of the Zener diode 51 is set at 5 V, the gate current of the thyristor 43 does not flow until the both ends of the resistor 53, 54 reach 10 V and the middle point exceeds 5V, that is, the gate current of the thyristor 43 does not flow because the output of the comparator 50 becomes high until the alternating-current voltage reaches 10 V in the positive half cycle, and hence the thyristor 43 is not ignited, and in this period the capacitor 44 is being charged, and the charged voltage of the capacitor 44 is the action voltage of the constant voltage circuit 46 and the power voltage of the control circuit 47.

What is of particular note herein is that if the alternating-current commercial power source 41 is changed over to 110 V, 120 V or 220 V, that is, if the voltage varies depending on the export destination country, by setting the Zener voltage of the Zener diode 51 at 5 V, the thyristor 43 is not ignited in the positive half cycle until the voltage is raised to 10 V, so that the capacitor 44 is always charged at 10 V.

That is, however the alternating-current commercial power source 41 varies, the constant voltage circuit 46 and control circuit 47 can be used without any change, and the cost may be substantially lowered as compared with the conventional constitution of obtaining a control voltage of 10 V by a transformer suited to the local voltage.

At this power voltage of 10 V obtained by the capacitor 44, the constant voltage circuit 46 and control circuit 47 operate, and while the temperature is low in the hot compartment 48, the resistance of the temperature sensor 49 is large, and the voltage of the comparative voltage input terminal of the comparator 56 is lower than the voltage of the reference voltage input terminal, so that the output of the comparator 56 is high.

As clear from the description herein, in the positive half cycle, when exceeding 10 V, the thyristor 43 conducts to feed power to the heater 42 to heat in low mode. However, while the temperature in the hot compartment 48 is low, it is necessary to feed power to the heater 42 also in negative half cycle, and in this negative half cycle, if the output of the comparator 56 is high as mentioned above, the current flows from the alternating-current commercial power source 41 into resistor 66, transistor 63, resistor 65, diode 62, resistor 53, capacitor 44, and heater 42, and in this state the potential at the output terminal 61 of the control circuit 47 climbs up. As a result, the output of the comparator 50 becomes low, and the gate current of the thyristor 43 flows to turn on, thereby heating by the heater 42 in high mode.

As a result, the temperature in the hot compartment 48 is raised and soon reaches a set temperature, and the voltage at the comparative voltage input terminal becomes higher than the voltage at the reference voltage input terminal of the comparator 56, so that the output of the comparator 56 becomes low.

Then, in the negative half cycle, the current flowing through the resistor 66, transistor 63 and resistor 65 flows to the comparator 56 side, and the output of the comparator 50 becomes high, and gate current is not supplied into the thyristor 43, and the thyristor 43 is cut off, and in this negative half cycle, power feeding to the heater 42 is cut off.

Of course, in the positive half cycle, the thyristor 43 is turned on when exceeding 10 V, and power is fed to the heater 42, but since the current if fed only in half wave, heating is in low mode, that is, keeping warmth is effected. After reaching the set temperature, in this way, positive half wave is supplied to the heater 42, and therefore in order that the temperature in the hot compartment 48 may not be raised suddenly by this keeping warmth operation, the rating of the heater 42 or the like must be considered sufficiently.

In this way, the circuit is designed to operate the thyristor 43 only in the positive half cycle, so that a control voltage of 10 V may be always obtained by the capacitor 44.

In this embodiment, same as in the first and second embodiments, as the current receiving element, the heater 42 may be replaced by a motor, a lamp, or other electric component or electronic component. In such a case, the temperature sensor 49 may be replaced by a sensor corresponding to the current receiving element, and the operation of the control circuit may be adjusted accordingly.

Embodiment 4

A fourth embodiment of the invention is described below by reference to the drawing.

Figure 4:
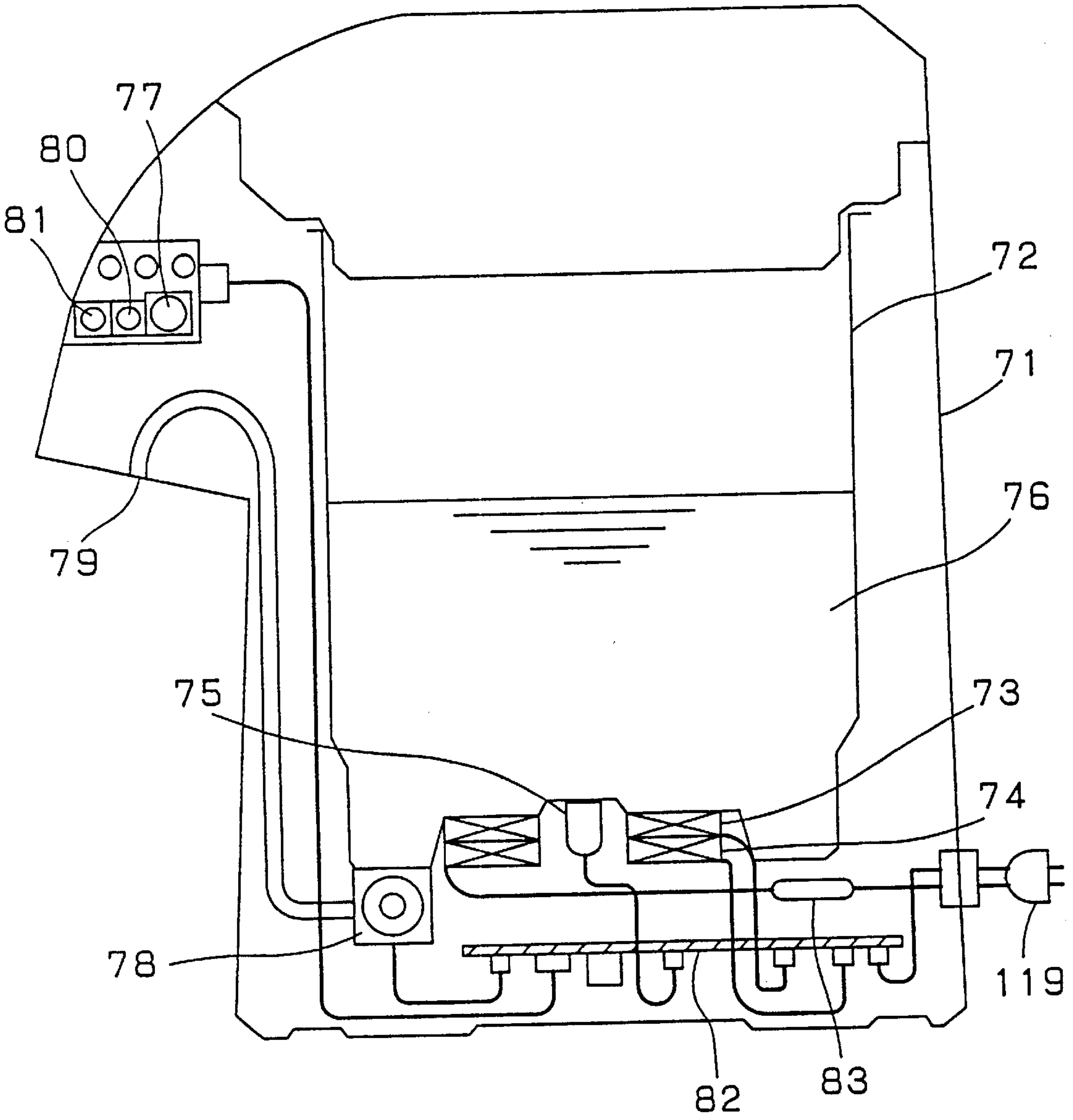
FIG. 4 is a sectional view showing the structure of an electric water heater when a current feed control circuit in an fourth embodiment of the invention is applied in an electric water heater.

FIG. 4 shows an example of applying the current feed control circuit in the fourth embodiment in an electric water heater.

In FIG. 4, reference numeral 71 is a main body case, and a container 72 with an open top is provided in the main body case 71.

In the bottom of the container 72, a boiling heater 73, an warmth keeping heater 74, and a thermistor 75 as temperature detector are provided.

That is, water 76 in the container 72 is heated by the boiling heater 73 or warmth keeping heater 74, and is poured out from anoutlet 79 by a feeding motor 78 by manipulation of a feeding switch 77. Prior to pouring, it is unlocked by manipulating an unlock switch 80, and when the feeding switch 77 is manipulated, hot water is poured outas mentioned above. After pouring, it is locked again.

In the warmth keeping state by the warmth keeping heater 74, when desired to boil the water 76 again, a reboiling switch 81 is manipulated, so that power is fed into the boiling heater 73 to boil again. Such control is effected by a control unit 82 provided in the main body case 71.

In FIG. 4, reference numeral 83 is a temperature fuse, and 119 is a power plug for connecting a commercial power source.

Figure 5:
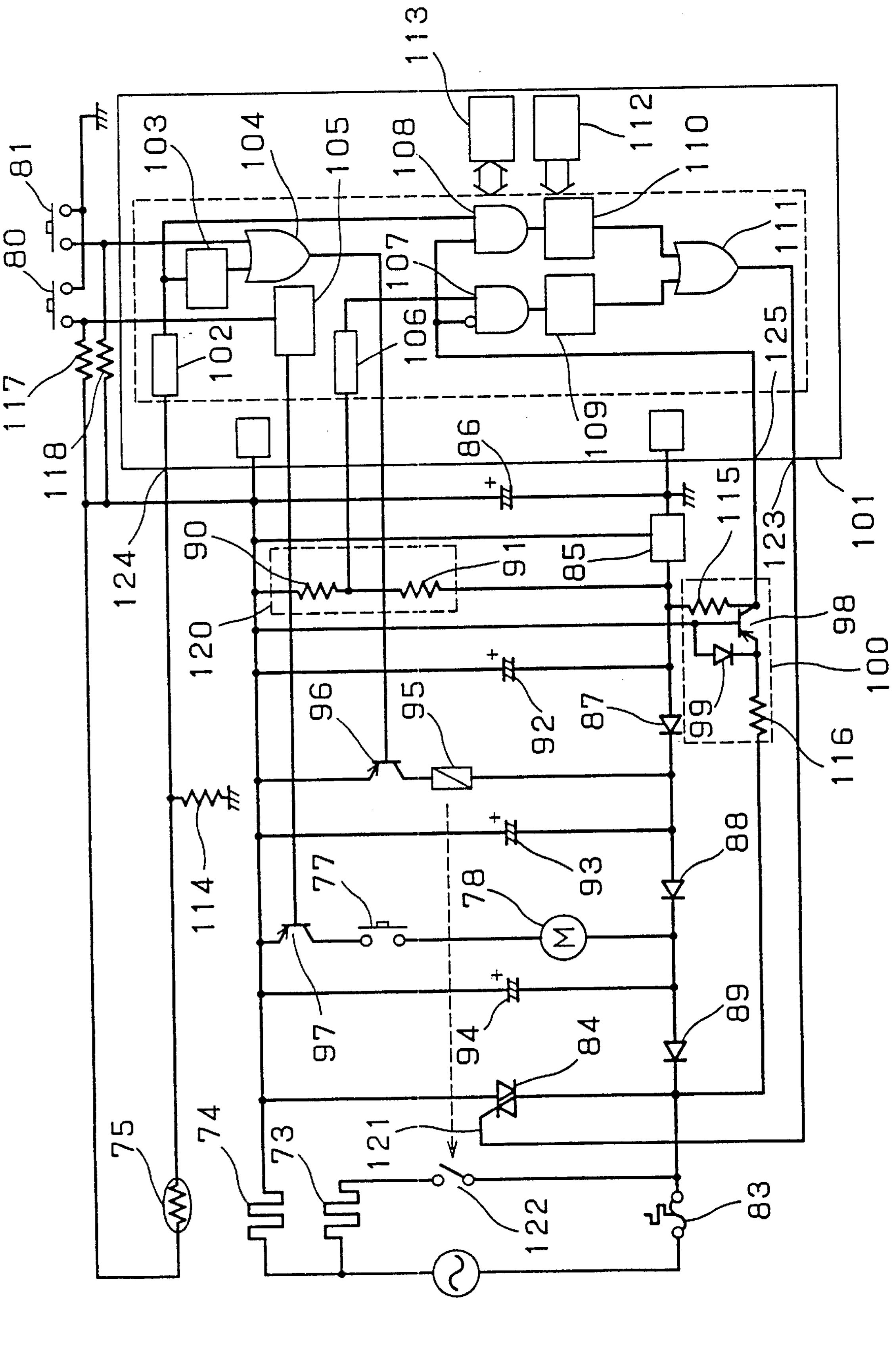
FIG. 5 is a circuit diagram of the current feed control circuit in the same embodiment.

FIG. 5 shows the control circuit in the electric water heater shown in FIG. 4.

As shown in FIG. 5, a thyristor 84 is placed in the current travelling route of the warmth keeping heater 74.

A series connection circuit of capacitor 92 and diodes 87, 88, 89 is connected parallel to this thyristor 84.

Voltage detecting means 120 composed of a series connection circuit of resistances 90, 91, and a series connection circuit of power source stabilizing means 85 and capacitor 86 are connected parallel to the capacitor 92. A series circuit of capacitor 93 and diode 87 is connected parallel to the voltage detecting means 120, and a series circuit of capacitor 94 and diode 88 is connected parallel to the capacitor 93.

Moreover, a series connection circuit of relay coil 95 and transistor 96 is connected parallel to the capacitor 93.

A series connection circuit of feeding motor 78, feeding switch 77 and transistor 97 is connected parallel to the capacitor 94. Supply voltage polarity judging means 100 composed of a parallel connection circuit of diode 99 and base to emitter of transistor 98 is connected parallel to the thyristor 84.

A control circuit 101 is connected parallel to the capacitor 86.

That is, the power source of the control circuit 101 is obtained from the capacitor 86.

In this control circuit 101, an A/D converter 102 is connected to the thermistor 75, and temperature judging means 103 and OR circuit 104 are connected to this A/D converter 102, and the output of the OR circuit 104 is connected to the base of the transistor 96.

Unlock control means 105 is connected to the unlock switch 80, and the output of the unlock control means 105 is connected to the base of the transistor 97.

A connection point of the resistor 90, 91 composing voltage detecting means 120 is connected to an A/D converter 106, and the output of the A/D converter 106 is connected to one end of an AND circuit 107.

The output of the A/D converter 102 connected to the thermistor 75 is connected to one end of an AND circuit 108.

At other inputs of these AND circuits 107, 108, the output of the supply voltage polarity judging means 100 is connected, so that either one is selected and operated.

At the output of the AND circuit 107, voltage judging means 109 is connected, and at the output of the AND circuit 108, temperature judging means 110 is connected, and the outputs of these means 109, 110 are connected to a gate 121 of the thyristor 84 from a control terminal 123 through an OR circuit 111.

Figure 6:
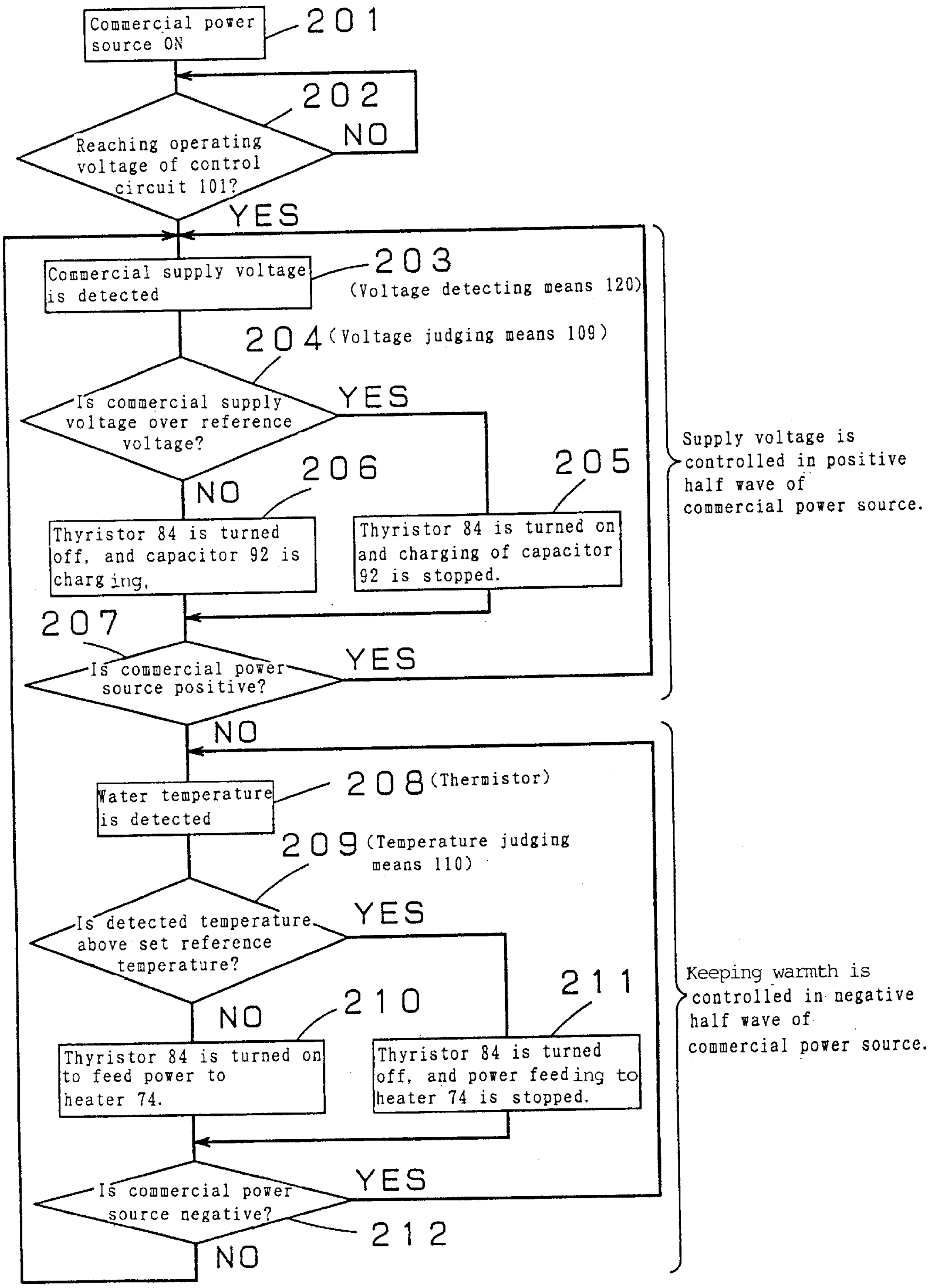
FIG. 6 is a flowchart showing operation flow in the same embodiment.

The operation of the control circuit 101 is executed by the program written in a ROM 112 as shown in FIG. 6.

Besides, a RAM 113 is also utilized as a temporary waiting position of result of calculation during execution of program.

In FIG. 5, reference numeral 122 is a relay contact switch connected in series to the boiling heater 73, and this relay contact switch 122 is opened and closed by the relay coil 95.

Reference numerals 114, 115, 116, 117, 118 are resistor, 124 is a temperature detecting input terminal, and 125 is a polarity input terminal.

Referring now to the flowchart in FIG. 6, the operation is described below.

At step 201, when the power plug 119 in FIG. 4 is connected to the commercial power source, in the case the reference value of the voltage judging means 109 is, for example, 10 V, the thyristor 84 is not turned on until the voltage is raised from 0 V to 10 V in the positive half cycle of the alternating-current voltage, and in this period the capacitors 92, 93, 94 are charged through diodes 87, 88, 89.

In this case, if the capacitor 92 exceeds, for example, 5 V, the capacitor 86 is stabilized at 5 V by the power source stabilizing means 85.

That is, by this 5 V, the operation of the control circuit 101 is stabilized.

When the capacitors 86, 92, 93, 94 are thus charged to individual values, at step 203, detecting at the middle point of the resistor 90, 91 of the voltage detecting means 120, this middle point reaches, for example, 4 V, and the control voltage 101 transmits that this 4 V is reached, that is, the supply voltage has reached 10 V, to the AND circuit 107 through the A/D converter 106, and it is judged that the voltage has reached 4 V by the voltage judging means 109 at step 204, and at step 205, moreover, its output is transmitted to the gate 121 of the thyristor 84 through the OR circuit 111, so that the thyristor 84 is turned on. That is, up to this ON state, in this positive half cycle, until the supply voltage reaches the reference value of 10 V, that is, until the middle point of the resistances 90, 91 reaches 4 V, a current for charging the capacitors 86, 92, 93, 94 flows, and this current also flows into the warmth keeping heater 74. Next, by exceeding the reference value of the voltage judging means 109, when the thyristor 84 is turned on, the charging current does not flow into the capacitors 86, 92, 93, 94, and at this time, the power is fed into the warmth keeping heater 74 through the thyristor 84. That is, in the positive half cycle, power is fed continuously to the warmth keeping heater 74.

What is of particular note herein is that if the commercial power source is changed over to 110 V, 120 V, 220 V or 240 V, that is, if the voltage varies depending on the export destination country, in the positive half cycle, by setting the voltage at the middle point divided by the resistances 90, 91 at, for example, 4 V, the thyristor 84 is kept off until a stabilized power source of 5 V is supplied to the capacitor 86, or until the capacitors 92, 93, 94 reach 10 V at step 206, so that a power voltage of the control circuit 101 may be obtained. At step 207, when the commercial power source is positive, going back to step 203, the same process is repeated.

That is, if the commercial power source varies, the control circuit 101 can be used without making any change, and it is not necessary at all to use a transformer for obtaining a power source of the control circuit 101 in every nation as in the prior art.

In this way, the stable 5 V power source from the capacitor 86 can be supplied to the control circuit 101, and at step 207 if the commercial power source is judged to be negative by the supply voltage polarity judging means 100, the temperature of the water 76 is detected by the thermistor 75 at step 208, and the detected temperature is supplied into the A/D converter 102 and temperature judging means 103, and when the water temperature is lower than the set temperature at step 209, an output is sent to the transistor 96 through the OR circuit 104 by the temperature judging means 103, and as a result, at step 210, a relay contact switch 122 is closed by the relay coil 95, thereby feeding power into the boiling heater 73.

At this time, since the boiling heater 73 is connected only to the commercial power source through the relay contact switch 122, power source of full wave is supplied into the heater 73.

At step 211, when the temperature of the water 76 heated by the boiling heater 73 reaches the water temperature set by the temperature judging means 103, the output supplied to the transistor 96 through the OR circuit 104 is cut off, and the relay contact switch 122 is opened consequently, so that power feeding to the boiling heater 73 is cut off. At step 212, if the commercial power source is negative at the supply voltage polarity judging means 100, the process goes to step 208, and if not negative, the process returns to step 203 and is repeated.

Thereafter, the power is supplied to the warms keeping heater 74, and in this warmth keeping heater 74, in the positive half cycle as mentioned above, a current is always supplied through the charging route of capacitors 86, 92, 93, 94 or the thyristor 84.

In the negative half cycle, the state of coming into the negative half cycle is detected by the supply voltage polarity judging means 100, and, as a result, the output from this supply voltage polarity changing means 100 is supplied into the AND circuit 108 connected to the temperature judging means 110.

That is, in this negative half cycle, the present water temperature in degrees centigrade is detected by the thermistor 75, and when the output is lower than the temperature set in the temperature judging means 110, for example, 80° C., power is supplied into the gate 121 of the thyristor 84 through a control terminal 123, from the temperature judging means 110 to the OR circuit 111, and accordingly, also in the negative half cycle, power is fed to the warmth keeping heater 74 through the thyristor 84, and it is controlled to return the water temperature to the set point.

In this embodiment, same as in the first to third embodiments, as the current receiving element, the warms keeping heater 74 may be replaced by motor, lamp, or other electric component or electronic component. In this case, too, the temperature sensor 75 may be replaced by a sensor corresponding to the current receiving element, and the operation of the control circuit may be adjusted accordingly.

In the foregoing embodiments, the reference voltage of the voltage judging means of Zener diode or the like, and the numerical value of set voltage are only examples, and my be changed freely.

The reference voltage and set voltage may not be always fixed, but may be varied freely by using a variable resistor or the like as required. For example, it may be easily realized by using a variable resistor for the voltage detecting means 120 in FIG. 5 in the fourth embodiment.

INDUSTRIAL APPLICABILITY

As clear from the description herein, whatever the connected commercial supply voltage may be, a specified power voltage of control circuit is obtained in the first capacitor by the control of thyristor by the control terminal connected to the gate of the thyristor, so that conventional transformer is not necessary, and it is possible to present at low cost. Besides, the control circuit for controlling the thyristor can be composed by making use of part of the control circuit provided in each appliance, and it is not necessary to install an exclusive control circuit individually, so that a simple and inexpensive constitution can be presented also from this viewpoint.

REFERENCE NUMERALS

1 Alternating-current commercial power source
2 Heater
3 Thyristor
4 Capacitor
5 Diode
6 Control circuit
7 Hot compartment
8 Temperature sensor
9 Zener diode
10 Comparator
11, 12, 13 Resistor
14 Photo thyristor
15 Light emitting diode
16, 18 Resistor
17 Thyristor

19 Diode
21 Water heater
22 Boiling heater
23 Motor
24, 27 Capacitor
25 Relay
26, 28 Diode
29, 30 Switch
31 Fuse
41 Alternating-current commercial power source
42 Heater
43 Thyristor
44 Capacitor
45 Diode
46 Constant voltage circuit
47 Control circuit
48 Hot compartment
49 Temperature sensor
50 Comparator
51 Zener diode
52~55 Resistor
56 comparator
57~59 Resistor
60 Polarity judging circuit
61 Output terminal
62 Diode
63 Transistor
64~66 Resistor
71 Main body case
72 Container
73 Boiling heater
74 Insulating heater
75 Thermistor
76 Water
77 Feed switch
78 Motor
80 Unlock Switch
81 Reboiling switch
82 Control unit
83 Temperature fuse
84 Thyristor
85 Power source stabilizing means
86 Capacitor
87, 88, 89 Diode
90, 91 Resistor
92, 93, 94 Capacitor
95 Relay coil
96, 97, 98 Transistor
99 Diode
100 Supply voltage polarity judging means
101 Control circuit
102 A/D converter
103 Temperature judging circuit
104 OR circuit
105 Unlock control means
106 A/D converter
107, 108 AND circuit
109 Voltage judging means
110 Temperature judging means
111 OR circuit
112 ROM
113 RAM
114, 115, 116, 117, 118 Resistor
119 Power plug
120 Voltage detecting means
121 Gate
122 Relay contact switch
123 Control terminal
124 Temperature detection input terminal
125 Polarity input terminal

What is claimed is:

1. A current feed control circuit of an electronic appliance comprising a current receiving element, a bidirectional three-terminal thyristor placed in the current travelling route of said current receiving element, a series connection circuit of a first capacitor as power source of control and a first diode connected parallel to said bidirectional three-terminal thyristor, a constant voltage element having a cathode connected to the gate of said bidirectional three-terminal thyristor, and a control circuit connected parallel to said first capacitor, with its control terminal connected to the gate of said bidirectional three-terminal thyristor, wherein power from an alternating power supply having both a positive cycle and a negative cycle is coupled to said current receiving element under control of said control circuit, said control circuit controlling the coupling of said power to said receiving element in response to a sensed parameter of said receiving element.

2. A current feed control circuit of an electronic appliance of claim 1, wherein a series connection circuit of a second capacitor and a second diode is connected parallel to said first capacitor, and a load element is connected parallel to said second capacitor.

3. An electronic appliance comprising a current feed control circuit of claim 1, wherein said current receiving element comprises a motor, a relay, or light emitting device.

4. An electronic appliance comprising a current feed control circuit of claim 1 or claim 2, wherein said current receiving element includes a heater and said sensed parameter includes the temperature of an object heated by the heater, and further including a temperature sensor for detecting the temperature of the object heated by the heater directly or indirectly, wherein the temperature sensor is connected to the control circuit of said current feed control circuit.

5. An electronic appliance comprising a current feed control circuit of claim 1 or claim 2, wherein said current receiving element includes a motor and said sensed parameter includes the rotating speed of the motor, and further including a sensor for detecting the rotating speed of the motor directly or indirectly, wherein the sensor is connected to the control circuit of said current feed control circuit.

6. An electronic appliance comprising a current feed control circuit of claim 1 or claim 2, wherein said current receiving element includes a lamp and said sensed parameter includes the illumination by the lamp, and further including a sensor for detecting the illumination by the lamp directly or indirectly, wherein the sensor is connected to the control circuit of said current feed control circuit.

7. A current feed control circuit of an electronic appliance comprising a current receiving element, a bidirectional three-terminal thyristor placed in the current travelling route of said current receiving element, a series connection circuit of a first capacitor for control power source and a first diode connected parallel to said bidirectional three-terminal thyristor, a constant voltage circuit having its output terminal connected to the gate of said bidirectional three-terminal thyristor, and a control circuit connected parallel to said first capacitor, with its output terminal connected to a comparative voltage input terminal of said constant voltage circuit, wherein said constant voltage circuit includes a comparator, a reference voltage input terminal connected to an input side of said comparator, a constant voltage element connected to said reference voltage input terminal, wherein power from an alternative power supply having both a positive cycle and a negative cycle is coupled to said current receiving element under control of said control circuit, said control circuit controlling the coupling of said power to said receiving element in response to a sensed parameter of said receiving element.

8. A current feed control circuit of an electronic appliance of claim 7, wherein the control circuit includes a second comparator having a detector connected to its comparative voltage input terminal, and a polarity judging circuit connected to the output terminal of the second comparator.

9. An electronic appliance comprising a current feed control circuit of claim 7 or claim 8, wherein said current receiving element includes a heater and said sensed parameter includes the temperature of an object heated by the heater, and further including a temperature sensor for detecting the temperature of the object heated by the heater directly or indirectly, wherein the temperature sensor is connected to the control circuit of said current feed control circuit.

10. An electronic appliance comprising a current feed control circuit of claim 7 or claim 8, wherein said current receiving element includes a motor and said sensed parameter includes the rotating speed of the motor, and further including a sensor for detecting the rotating speed of the motor directly or indirectly, wherein the sensor is connected to the control circuit of said current feed control circuit.

11. An electronic appliance comprising a current feed control circuit of claim 7 or claim 8, wherein said current receiving element includes a lamp and said sensed parameter includes the illumination by the lamp, and further including a sensor for detecting the illumination by the lamp directly or indirectly, wherein the sensor is connected to the control circuit of said current feed control circuit.

12. A current feed control circuit of an electronic appliance comprising a first current receiving element, a bidirectional three-terminal thyristor placed in the current travelling route of said first current receiving element, a series connection circuit of a first capacitor and a first diode connected parallel to said bidirectional three-terminal thyristor, a control circuit connected parallel to said first capacitor, with its control terminal connected to a gate of said bidirectional three-terminal thyristor, and power source stabilizing means disposed in the control circuit and current travelling route of the first capacitor, wherein a voltage detecting means is connected parallel to the first capacitor, and said control circuit compares the output of said voltage detecting means with a reference value generated by a voltage judging means, and couples the output of said voltage detecting means to the gate of the bidirectional three-terminal thyristor through said control terminal, wherein a power supply is coupled to said current receiving element under control of said control circuit.

13. An electronic appliance comprising a current feed control circuit of claim 12, a first heater as its first current receiving element, and a temperature sensor for detecting the temperature of the object heated by the first heater directly or indirectly, wherein said temperature sensor is connected to the control circuit of said current feed control circuit, and said control circuit compares the output of said temperature sensor with a reference value generated by a temperature judging means, and sends the output of said control circuit to the gate of said thyristor through said control terminal.

14. An electronic appliance of claim 13, wherein a commercial power source polarity detecting means is connected parallel to said thyristor, and said voltage judging means and temperature judging means are selectively operated depending on the output of the commercial power source polarity detecting means.

15. An electronic appliance of claim 13 or 14, wherein the reference value of the voltage judging means is freely variable.

16. An electronic appliance of claim 15, wherein the reference value of the temperature judging means is freely variable.

17. An electronic appliance of claim 15, wherein a series connection circuit of a second heater used as a second current receiving element and a current feed control element is connected parallel to said series connection circuit of said first heater and said thyristor, and the current feeding of the current feed control element is controlled by the output of said control circuit.

18. An electronic appliance of claim 15, wherein a series connection circuit of a second capacitor and a second diode is connected parallel to said first capacitor, a second current receiving element is connected parallel to said second capacitor, and the current feeding of the second current receiving element is controlled by said control circuit.

19. An electronic appliance of claim 14, wherein a series connection circuit of a second capacitor and a second diode is connected parallel to said first capacitor, a second current receiving element is connected parallel to said second capacitor, and the current feeding of the second current receiving element is controlled by said control circuit.

20. An electronic appliance of claim 19, wherein a motor is used as the second current receiving element.

21. An electronic appliance of claim 14, wherein the reference value of the temperature judging means is freely variable.

22. An electronic appliance of claim 14, wherein a series connection circuit of a second heater used a second current receiving element and a current feed control element is connected parallel to said series connection circuit of said first heater and said thyristor, and the current feeding of the current feed control element is controlled by the output of said control circuit.

23. An electronic appliance of claim 13, wherein the reference value of the temperature judging means is freely variable.

24. An electronic appliance of claim 23, wherein a series connection circuit of a second heater used as a second current receiving element and a current feed control element is connected parallel to said series connection circuit of said first heater and said thyristor, and the current feeding of the current feed control element is controlled by the output of said control circuit.

25. An electronic appliance of claim 23, wherein a series connection circuit of a second capacitor and a second diode is connected parallel to said first capacitor, a second current receiving element is connected parallel to said second capacitor, and the current feeding of the second current receiving element is controlled by said control circuit.

26. An electronic appliance of claim 13, wherein a series connection circuit of a second heater used as a second current receiving element and a current feed control element is connected parallel to said series connection circuit of said first heater and said thyristor, and the current feeding of the current feed control element is controlled by the output of said control circuit.

27. An electronic appliance of claim 26, wherein a series connection circuit of a second capacitor and a second diode is connected parallel to said first capacitor, a second current receiving element is connected parallel to said second capacitor, and the current feeding of the second current receiving element is controlled by said control circuit.

* * * * *